United States Patent
Chen et al.

(10) Patent No.: US 9,164,340 B2
(45) Date of Patent: Oct. 20, 2015

(54) PIXEL STRUCTURE AND LIQUID CRYSTAL PANEL

(71) Applicant: AU Optronics Corp., Hsin-Chu (TW)

(72) Inventors: Ju-Chin Chen, Hsin-Chu (TW); Hsiao-Wei Cheng, Hsin-Chu (TW); Shih-Chyuan Fan Jiang, Hsin-Chu (TW); Yu-Chia Huang, Hsin-Chu (TW)

(73) Assignee: AU Optronics Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/311,339

(22) Filed: Jun. 22, 2014

(65) Prior Publication Data
US 2015/0212380 A1    Jul. 30, 2015

(30) Foreign Application Priority Data
Jan. 27, 2014   (TW) .............................. 103102982 A

(51) Int. Cl.
G02F 1/1368   (2006.01)
G02F 1/1362   (2006.01)
H01L 27/12    (2006.01)

(52) U.S. Cl.
CPC ........ *G02F 1/136286* (2013.01); *G02F 1/1368* (2013.01); *H01L 27/124* (2013.01)

(58) Field of Classification Search
CPC ............ G06F 1/136286; G06F 1/1368; H01L 27/124
See application file for complete search history.

(56) References Cited

U.S. PATENT DOCUMENTS

| | | | |
|---|---|---|---|
| 6,784,965 B2 * | 8/2004 | Kim et al. ...................... | 349/141 |
| 7,678,619 B2 * | 3/2010 | Lee ............................... | 438/129 |
| 7,679,707 B2 | 3/2010 | Tanaka | |
| 7,851,920 B2 * | 12/2010 | Lee et al. ...................... | 257/762 |
| 2002/0130324 A1 * | 9/2002 | Song et al. ...................... | 257/72 |
| 2005/0088609 A1 * | 4/2005 | Cho .............................. | 349/187 |
| 2007/0042537 A1 * | 2/2007 | Lee ............................... | 438/158 |
| 2009/0212290 A1 * | 8/2009 | Youn et al. ...................... | 257/59 |
| 2012/0199834 A1 * | 8/2012 | Jeon et al. ...................... | 257/59 |
| 2015/0108483 A1 * | 4/2015 | Lee et al. ...................... | 257/71 |
| 2015/0160519 A1 * | 6/2015 | Cho et al. ...................... | 349/138 |
| 2015/0205154 A1 * | 7/2015 | Koo et al. ...................... | 349/42 |

* cited by examiner

Primary Examiner — Allan R Wilson
(74) Attorney, Agent, or Firm — Winston Hsu; Scott Margo

(57) ABSTRACT

A pixel structure includes a substrate, a plurality of gate lines and data lines, and at least one first pixel. The gate lines and the data lines are disposed on the substrate. The first pixel is disposed on the substrate and electrically connected to corresponding gate line and data line. The first pixel includes a first electrode, a first dielectric layer and a second electrode. The first electrode is disposed on the substrate. The first dielectric layer is disposed on the first electrode, and the first dielectric layer has at least one first island structure. The second electrode is disposed on a top surface of the first island structure, and the second electrode partially exposes the top surface of the first island structure.

16 Claims, 15 Drawing Sheets

PIXEL STRUCTURE AND LIQUID CRYSTAL PANEL

BACKGROUND OF THE INVENTION

1. Field of the Invention

The present invention relates to a pixel structure and a liquid crystal panel, and more particularly, to a pixel structure and a liquid crystal panel with high liquid crystal (LC) efficiency and low capacitive load.

2. Description of the Prior Art

With the advance of liquid crystal techniques, liquid crystal display (LCD) panel has been widely used in flat TV, notebook computer, mobile phone and various types of consuming electronic products. In order to solve the narrow viewing angle problem of LCD panel, a fringe field switching (FFS) LCD panel has been proposed. In an FFS LCD panel, the common electrode and the pixel electrode with different voltages are both disposed at different levels of the array substrate (also referred to as TFT substrate), and a wide viewing angle display effect can be achieved.

The pixel structure of a conventional FFS LCD panel includes a dielectric layer between the pixel electrode and the common electrode, and also between the data line and the common electrode. The thickness of the dielectric layer would affect LC efficiency. Specifically, with a constant voltage difference, when the thickness of the dielectric layer is thinner, the LC electrical field and the LC efficiency are higher; when the thickness of the dielectric layer is thicker, the LC electrical field and the LC efficiency are lower. Thus, when the LC efficiency is considered, the thickness of the dielectric layer is as thin as possible. However, when the common electrode is disposed over the pixel electrode, the thickness of the dielectric layer also affects the capacitive load between the common electrode and the data line. That is to say, when the thickness of the dielectric layer is thinner, the capacitive load between the common electrode and the data line is higher, which would increase power consumption.

Therefore, in the pixel structure of the conventional FFS LCD panel, there is a trade-off between the LC efficiency and the capacitive load of the common electrode and the data line.

SUMMARY OF THE INVENTION

It is therefore one of the objectives of the present invention to provide a pixel structure and a liquid crystal panel with high liquid crystal efficiency and low capacitive load.

According to an embodiment of the present invention, a pixel structure is provided. The pixel structure includes a substrate, a plurality of gate lines and a plurality of data lines and at least one first pixel. The gate lines and the data lines are disposed on the substrate. The first pixel is disposed on the substrate and electrically connected to one of the gate lines and one of the data lines. The first pixel includes a first electrode, a first dielectric layer and a second electrode. The first electrode is disposed on the substrate. The first dielectric layer is disposed on the first electrode, and the first dielectric layer has at least one first island structure. The second electrode is disposed on a top surface of the at least one first island structure, and the top surface of the first island structure is partially exposed by the second electrode.

According to another embodiment of the present invention, a liquid crystal panel is provided. The liquid crystal panel includes the aforementioned pixel structure, a counter substrate disposed on the pixel structure, and a display medium layer disposed between the pixel structure and the counter substrate.

According to still another embodiment of the present invention, a pixel structure is provided. The pixel structure includes a plurality of gate lines and a plurality of data lines and at least one first pixel. The gate lines and the data lines are disposed on the substrate. The first pixel is disposed in a pixel region on the substrate and electrically connected to one of the gate lines and one of the data lines. The first pixel includes a first electrode, a first dielectric layer and a second electrode. The first electrode is disposed on the substrate. The first dielectric layer is disposed on the first electrode. The first dielectric layer has one or more first island structures disposed in one or more buffer regions of the pixel region respectively, and a plurality of flat structures disposed in a plurality of connection regions of the pixel region respectively, where each of the connection regions is located between two adjacent buffer regions. The second electrode includes a plurality of branch electrodes disposed on the first dielectric layer. Each of the branch electrodes has two terminal portions located in the buffer regions respectively, a bend portion located in the buffer region, and two connection portions disposed on a top surface of the first island structure and located in the connection regions respectively, where two ends of each of the connection portions are connected to the terminal portion and the bend portion respectively.

According to yet another embodiment of the present invention, a pixel structure is provided. The pixel structure includes a plurality of gate lines and a plurality of data lines, at least one first pixel and at least one second pixel. The gate lines and the data lines are disposed on the substrate. The first pixel is disposed on the substrate and electrically connected to one of the gate lines and one of the data lines. The first pixel includes a first electrode, a first dielectric layer and a second electrode. The first electrode is disposed on the substrate. The first dielectric layer is disposed on the first electrode, and the first dielectric layer has at least one first island structure. The second electrode is disposed on a top surface of the first island structure. The second pixel includes a third electrode, a second dielectric layer and the fourth electrode. The third electrode is disposed on the substrate. The second dielectric layer is disposed on the third electrode, and the second dielectric layer does not comprise any island structures. The fourth electrode is disposed on a top surface of the second dielectric layer.

According to another embodiment of the present invention, a liquid crystal panel is provided. The liquid crystal panel includes the aforementioned pixel structure, a counter substrate disposed on the pixel structure, and a display medium layer disposed between the pixel structure and the counter substrate.

The dielectric layer of the pixel structure of the present invention has unequal thickness design, and the gap between adjacent branch electrodes is not equal to the gap of adjacent island structure of the dielectric layer. As a result, LC efficiency is improved without increasing the capacitive load between the common electrode and the data line.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
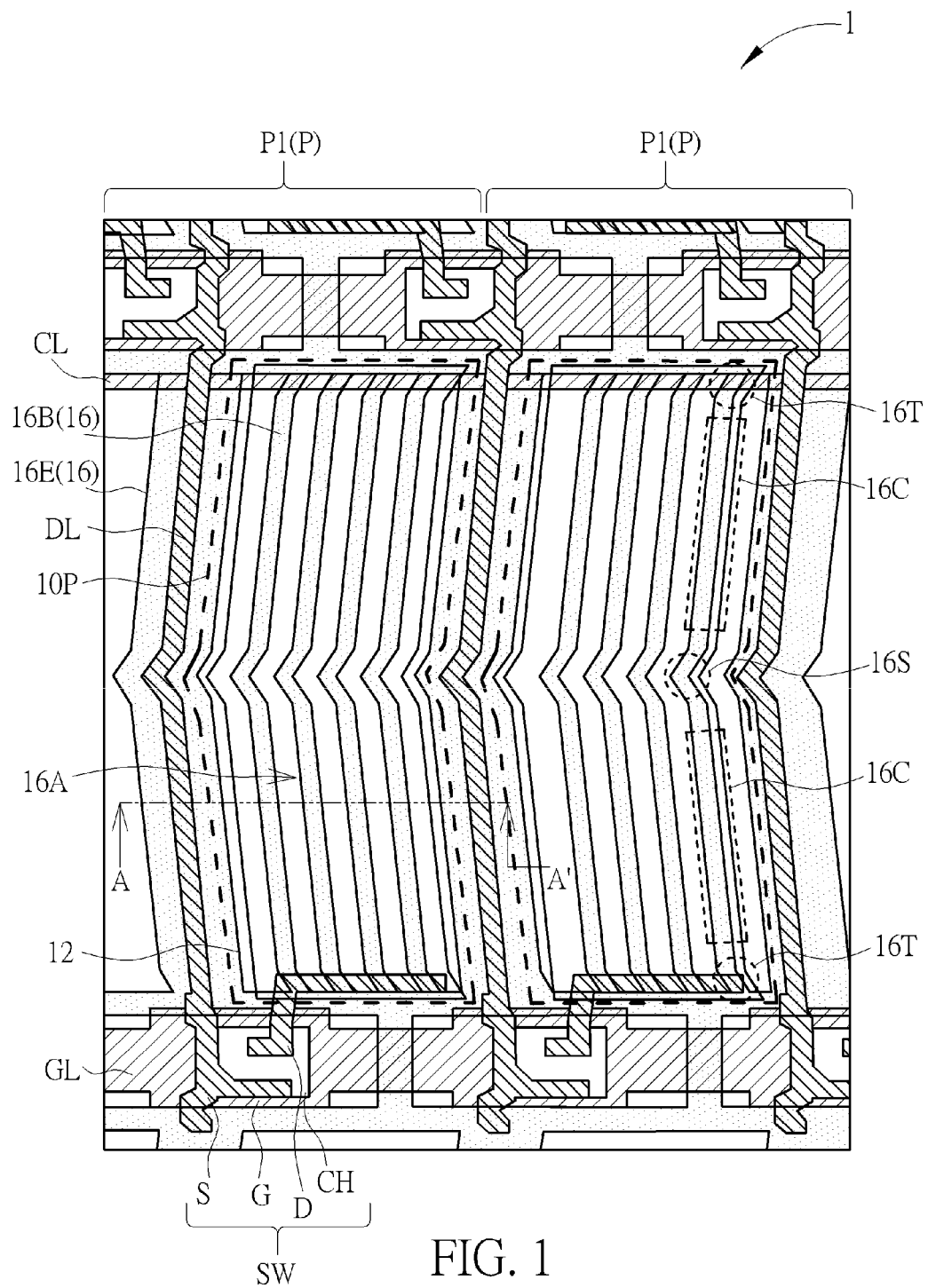
FIG. 1 is a top view of a pixel structure according to a first embodiment of the present invention.
Figure 2:
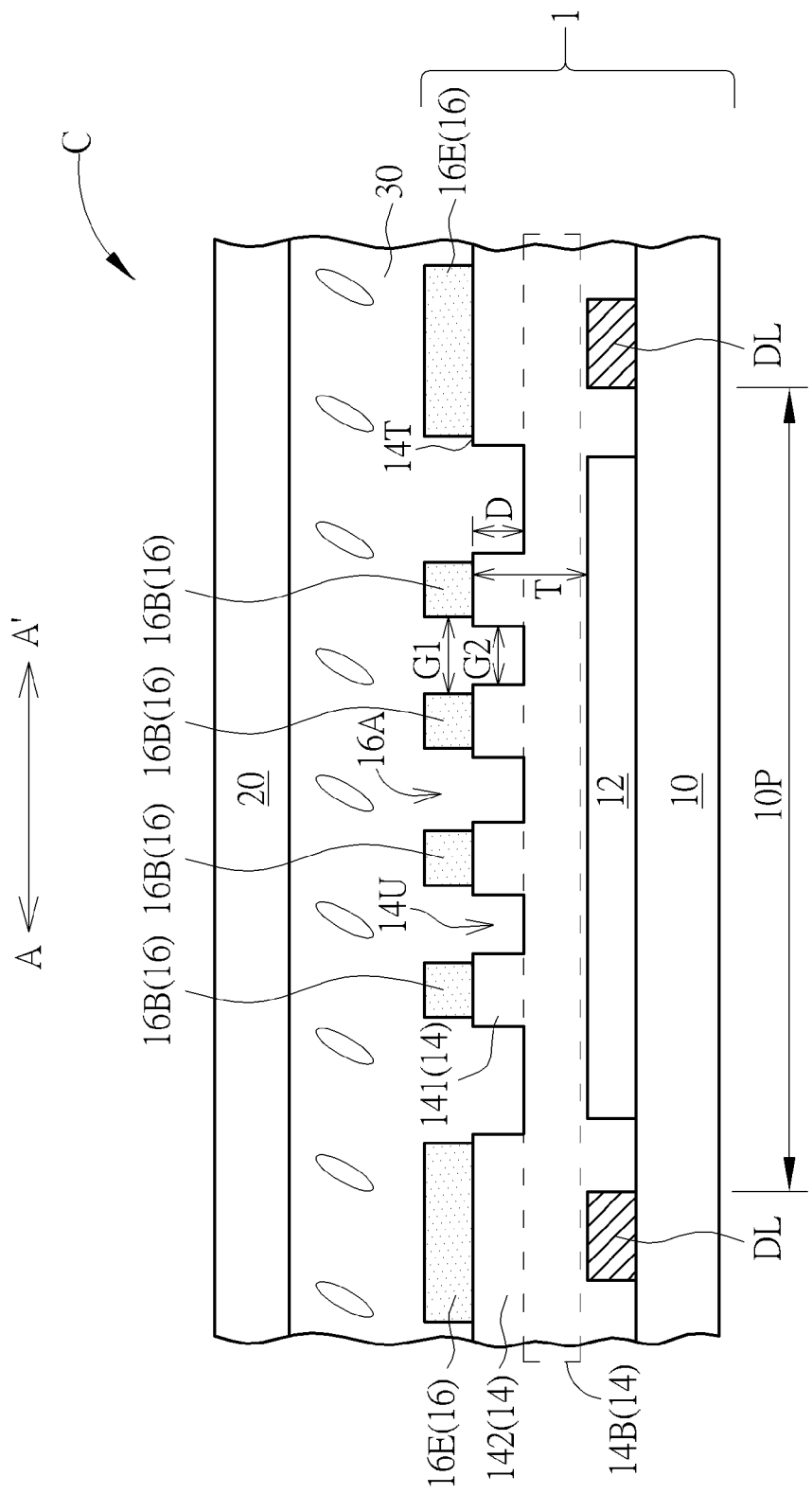
FIG. 2 is a cross-sectional view of the pixel structure of FIG. 1 along line A-A'.

Refer to FIG. 1 and FIG. 2. FIG. 1 is a top view of a pixel structure according to a first embodiment of the present invention, and FIG. 2 is a cross-sectional view of the pixel structure of FIG. 1 along line A-A'. In this embodiment, a pixel structure of an FFS LCD panel is used as an example, but not a limitation. The pixel structure of the present embodiment may be applied in other suitable display panels. As shown in FIG. 1 and FIG. 2, the pixel structure 1 of this embodiment includes a substrate 10, a plurality of gate line GL, a plurality of data lines DL and a plurality of pixels P. The substrate 10 may include a transparent substrate e.g. a glass substrate, a plastic substrate or a quartz substrate, but not limited thereto. The substrate 10 may be various types of rigid substrates or flexible substrates. The gate lines GL and the data lines DL are intersected, defining a plurality of pixel regions 10P (also referred to as sub-pixel regions). The pixels P (also referred to as sub-pixels) are disposed in the pixel regions 10P respectively, and at least one of the pixels P is a first pixel P. The first pixel P includes a first electrode 12, a first dielectric layer 14 and a second electrode 16. The first electrode 12 is disposed on the substrate 10, and electrically connected to one corresponding data line DL. The first dielectric layer 14 is disposed on the first electrode 12, and the first dielectric layer 14 has at least one first island structure 141. The second electrode 16 is disposed on the top surface 14T of the first island structure 141, the second electrode 16 partially exposes the top surface 14T of the first island structure 141, and the second electrode 16 is electrically connected to a common voltage source having a common voltage. In this embodiment, the first electrode 12 is a pixel electrode, and the second electrode 16 is a common electrode, but not limited thereto. In an alternative embodiment, the first electrode 12 may be a common electrode and the second electrode 16 may be a pixel electrode. In this embodiment, the first electrode 12 may be a full-surface electrode without any slits or branch electrodes. The second electrode 16 includes a plurality of branch electrodes 16B, and a slit 16A exists between any two adjacent branch electrodes 16B. In addition, each branch electrode 16B has two terminal portions 16T, a bend portion 16S and two connection portions 16C. Each connection portion 16C has a bar-shaped structure, for example, and the two connection portions 16C may be parallel or non-parallel to each other. The bend portion 16S has a bending point. For example, the bend portion 16S has a V-shaped structure. The two ends of the connection portions 16C are connected to the terminal portions 16T and the bend portion 16S respectively, the terminal portions 16T are disposed on the top surface 14T of the corresponding first island structure 141 and partially expose the top surface 14T of the first island structure 141. The bend portion 16S is disposed on the top surface 14T of the corresponding first island structure 141 and partially exposes the top surface 14T of the corresponding first island structure 141. In addition, the connection portions 16C may be disposed on the top surface 14T of the first island structure 141 or not disposed on the top surface 14T of the first island structure 141.

The first electrode 12 and the second electrode 16 may be transparent electrodes, and the material may include various types of transparent conductive materials e.g. indium tin oxide (ITO), indium zinc oxide (IZO), aluminum zinc oxide (AZO), aluminum indium oxide (AIO), indium oxide (InO), gallium oxide (GaO), carbon nanotube (CNT), nano silver particle, metal having a thickness less than 60 nanometers, alloy having a thickness less than 60 nanometers, transparent organic conductive material or other transparent conductive materials. The material of the first dielectric layer 14 may include inorganic dielectric material (e.g. silicon oxide, silicon nitride or silicon oxynitride), organic dielectric material, organic/inorganic hybrid material or a combination thereof. In addition, the first dielectric layer 14 may be a single-layered or a multi-layered structure.

The liquid crystal panel (liquid crystal display panel) C of this embodiment may further include a plurality of active switching devices SW, storage capacitors (not shown), alignment films (not shown), common lines CL, a counter substrate 20 and a display medium layer 30. The active switching device SW may be a thin film transistor (TFT) device such as a bottom gate TFT device, a top gate TFT device or other types of TFT devices. The active switching device SW includes a gate electrode G, a source electrode S, a drain electrode D and a semiconductor channel layer CH. The gate electrode G is electrically connected to one corresponding gate line GL, the source electrode S is electrically connected to one corresponding data line DL, and the drain electrode D is electrically connected to the corresponding first electrode 12. The material of the semiconductor channel layer CH may be various types of silicon-based materials (e.g. amorphous silicon, polycrystalline silicon, micro crystalline silicon or nanocrystalline silicon) or oxide semiconductor material (e.g. IGZO). The common line CL may be electrically connected to the second electrode 16 to provide the common voltage to the second electrode 16. In this embodiment, the common line CL is a straight common line substantially parallel to the gate line CL, but not limited thereto. In other alternative embodiments, the common line CL may be other shapes such as L-shaped, H-shaped or O-shaped. The counter substrate 20 is disposed on the pixel structure 1. The counter substrate 20 may include a transparent substrate, and other display devices (e.g. color filters, light-shielding patterns and alignment films (not shown)) may be disposed on the counter substrate 20. The display medium layer 30 is disposed between the pixel structure 1 and the counter substrate 20, i.e. between the substrate 10 and the counter substrate 20. Specifically, the display medium layer 30 may be disposed between the alignment film of the substrate 10 and the alignment film of the counter substrate 20. In this embodiment, the display medium layer 30 may be a liquid crystal layer, which can be driven by the voltage difference between the first electrode 12 and the second electrode 16 when displaying.

As shown in FIG. 2, there may be one or more first island structures 141, and the first dielectric layer 14 may further include a base structure 14B and at least one second island structure 142. The first island structures 141 and the second island structure 142 are disposed on the base structure 14B to form a plurality of cavities 14U. Specifically, the first island structure 141, the second island structure 142 adjacent to each other and the base structure 14B form one cavity 14U. In addition, the thickness sum T of the base structure 14B and the first island structure 141 is greater than the depth D of the cavity 14U. The second electrode 16 includes a plurality of branch electrodes 16B disposed on the top surfaces 14T of the first island structures 141 and partially exposing the top surfaces 14T of the first island structures 141 respectively, and the second island structure 142 overlaps the corresponding data line DL. Furthermore, the gap G1 between two adjacent branch electrodes 16B is greater than the gap G2 between two adjacent first island structures 141. The second electrode 16 may further include a fringe electrode 16E disposed on the top surface 14T of the second island structure 142 and exposing a portion of the top surface 14T of the second island structure 142.

The first electrode 12 and the second electrode 16 are insulated by the first dielectric layer 14, and thus LC efficiency is affected by the thickness of the first dielectric layer 14. For example, with a constant voltage difference between the first electrode 12 and the second electrode 16, when the thickness of the first dielectric layer 14 is thinner, the LC electrical field generated due to the voltage difference is higher, which increases the LC efficiency. In another aspect, when the thickness of the first dielectric layer 14 is thinner, a required LC efficiency can be achieved with a lower voltage difference between the first electrode 12 and the second electrode 16. In addition, the electrical field between the first electrode 12 and the second electrode 16 is sensitive to the gap G1 between two adjacent branch electrodes 16B, and thus the LC efficiency is also sensitive to the gap G1 between two adjacent branch electrodes 16B (i.e. the width of the slit 16A). On the other hand, the second electrode 16 and the data line DL are also insulated by the first dielectric layer 14, thus a larger thickness of the first dielectric layer 14 is able to reduce the capacitive load between the second electrode 16 and the data line DL and reduce power consumption. That is, when LC efficiency is considered, the thickness of the first dielectric layer 14 is supposed to be thinner; when capacitive load is considered, the thickness of the first dielectric layer 14 is supposed to be thicker. Therefore, to give consideration to both of LC efficiency and capacitive load, the first dielectric layer 14 has unequal thickness design. For example, the thickness sum T of the base structure 14B and the first island structure 141 is greater than the depth D of the cavity; the gap G1 between two adjacent branch electrodes 16B is greater than the gap G2 between two adjacent first island structures 141.

Refer to Table 1 and FIG. 2. Table 1 lists a simulation of LC efficiency at different ratios (G2/G1) of the gap G2 between two adjacent first island structures 141 to the gap G1 between two adjacent branch electrodes 16B and at different ratios (D/T) of the depth D of the cavity 14U to the thickness sum T of the base structure 14B and the first island structure 141. The definition of LC efficiency is as follows.

LC efficiency=$T\%$/(Array Tr*CF Tr*AR), where

T % is the transmittance of the liquid crystal panel C;
Array Tr is the transmittance of the pixel structure 1;
CF Tr is the transmittance of the counter substrate 20 where color filters, light-shielding patterns and alignment film are disposed thereon; and
AR is the aperture ratio of the liquid crystal panel C.

TABLE 1

|  |  | D/T | | | | | |
|---|---|---|---|---|---|---|---|
|  |  | 0 Å/ 6000 Å (0%) | 1200 Å/ 6000 Å (20%) | 2400 Å/ 6000 Å (40%) | 3600 Å/ 6000 Å (60%) | 4800 Å/ 6000 Å (80%) | 6000 Å/ 6000 Å (100%) |
| G2/G1 | 0 μm/5 μm (0%) | | | | | | |
|  | 1 μm/5 μm (20%) | | 100.44% | 100.22% | 100.18% | 100.11% | 100.07% |
|  | 2 μm/5 μm (40%) | | 101.34% | 102.07% | 102.40% | 102.65% | 103.05% |
|  | 3 μm/5 μm (60%) | | 101.96% | 103.34% | 104.03% | 104.10% | 103.49% |
|  | 4 μm/5 μm (80%) | | 102.91% | 104.83% | 105.92% | 106.28% | 106.10% |
|  | 5 μm/5 μm (100%) | 100% | 105.01% | 107.74% | 109.15% | 109.23% | 107.92% |

In the simulation of Table 1, LC efficiency=100% is a reference when the gap G2 between two adjacent first island structures 141 is equal to the gap G1 between two adjacent branch electrodes 16B (i.e. G2/G1=100%) and when the depth D of the cavity 14U is equal to the thickness sum T of the base structure 14B and the first island structure 141 (i.e. D/T=100%). As shown in Table 1, when the ratio of the gap G2 between two adjacent first island structures 141 to the gap G1 between two adjacent branch electrodes 16B is greater than or equal to 40% and less than 100% (i.e. 40%≤G2/G1<100%), LC efficiency is significantly increased. Specifically, when 60%≤G2/G1<100%, LC efficiency is more significantly increased; When 80%≤G2/G1<100%, LC efficiency is much more significantly increased. In addition, when the ratio of the depth D of the cavity 14U to the thickness sum T of the base structure 14B and the first island structure 141 is greater than or equal to 20% and less than or equal to 80% (i.e. 20%≤D/T≤80%), LC efficiency is significantly increased. Specifically, when 40%≤D/T≤80%, LC efficiency is more significantly increased; when 60%≤D/T≤80%, LC efficiency is much more significantly increased. The simulation proves that when the ratio of the gap G2 between two adjacent first island structures 141 to the gap G1 between two adjacent branch electrodes 16B and the ratio of the depth D of the cavity 14U to the thickness sum T of the base structure 14B and the first island structure 141 are within the aforementioned ranges, LC efficiency is significantly improved.

Figure 3:
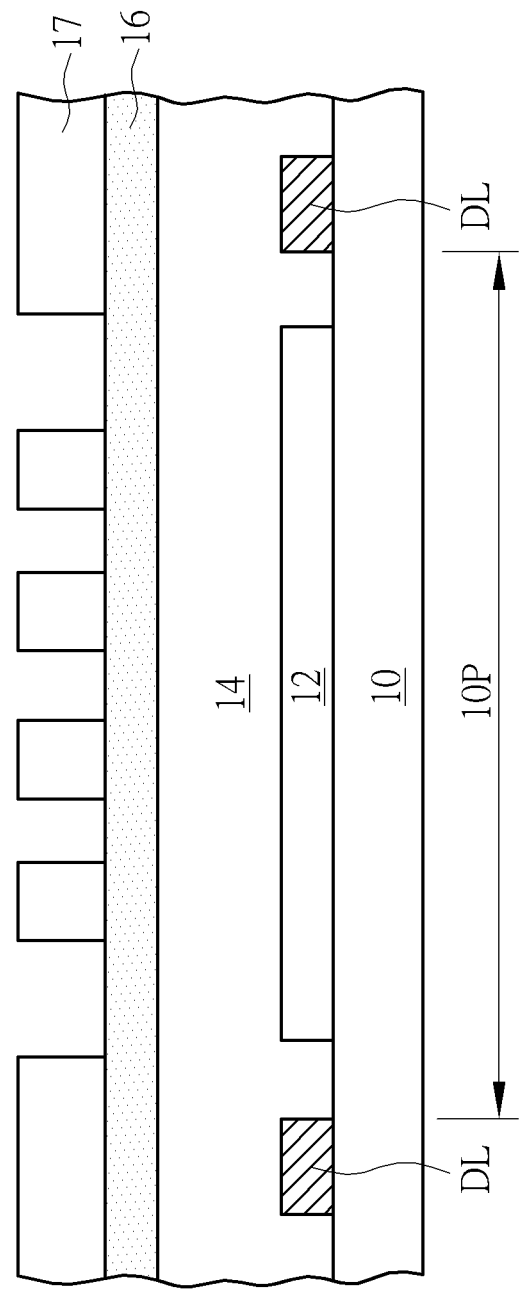
FIGS. 3-6 are schematic diagrams illustrating a method of fabricating a pixel structure according to an embodiment of the present invention.
Figure 4:
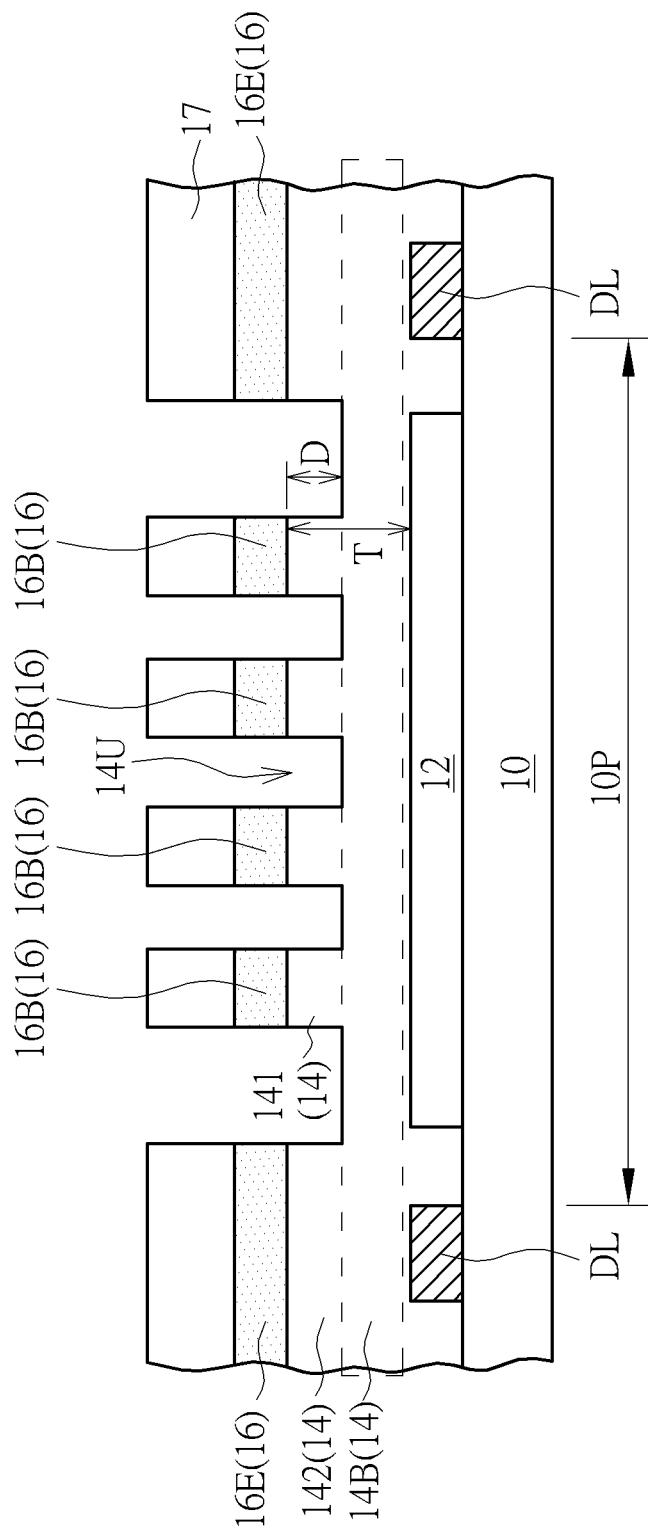

Refer to FIGS. 3-6 as well as FIG. 1. FIGS. 3-6 are schematic diagrams illustrating a method of fabricating a pixel structure according to an embodiment of the present invention. As shown in FIG. 3, the substrate 10 is provided, and the gate line GL (shown in FIG. 1), the data lines DL, the active switching devices SW (shown in FIG. 1) and the first electrodes 12 are formed on the substrate 10. Then, the first dielectric layer 14 is formed on the substrate 10 to cover the gate line GL (shown in FIG. 1), the data lines DL, the active switching devices SW (shown in FIG. 1) and the first electrodes 12. Subsequently, the second electrodes 16 are formed on the top surface 14T of the first dielectric layer 14. Afterward, a sacrificial pattern 17 (e.g. a photoresist pattern) is formed on the second electrodes 16, where the sacrificial pattern 17 exposes a portion of the second electrodes 16. As shown in FIG. 4, each of the second electrodes 16 exposed by the sacrificial pattern 17 is removed to form a plurality of branch electrodes 16B and at least one fringe electrode 16E, and a portion of the first dielectric layer 14 exposed by the sacrificial pattern 17 is removed. It is noted that only a portion of the first dielectric layer 14 exposed by the sacrificial pattern 17 is removed, and thus the remaining first dielectric layer 14 exposed by the sacrificial pattern 17 will form a base structure 14B, while the first dielectric layer 14 covered by the sacrificial pattern 17 will form the first island structures 141 and the second island structure 142, and cavities 14U will be formed in the removed portions of the first dielectric layer 14. In this embodiment, the formation of the branch electrodes 16B, the fringe electrode 16E and the cavity 14U may be carried out by a two-step etching process. For example, a wet etching process is performed to etch the second electrode 16 exposed by the sacrificial pattern 17 to form the branch electrodes 16B and the fringe electrode 16E. Then, a dry etching process is performed to etch a portion of the first dielectric layer 14 exposed by the sacrificial pattern 17 to form the cavities 14U. The formation of the branch electrodes 16B, the fringe electrode 16E and the cavity 14U is not limited by the above process.

Figure 5:
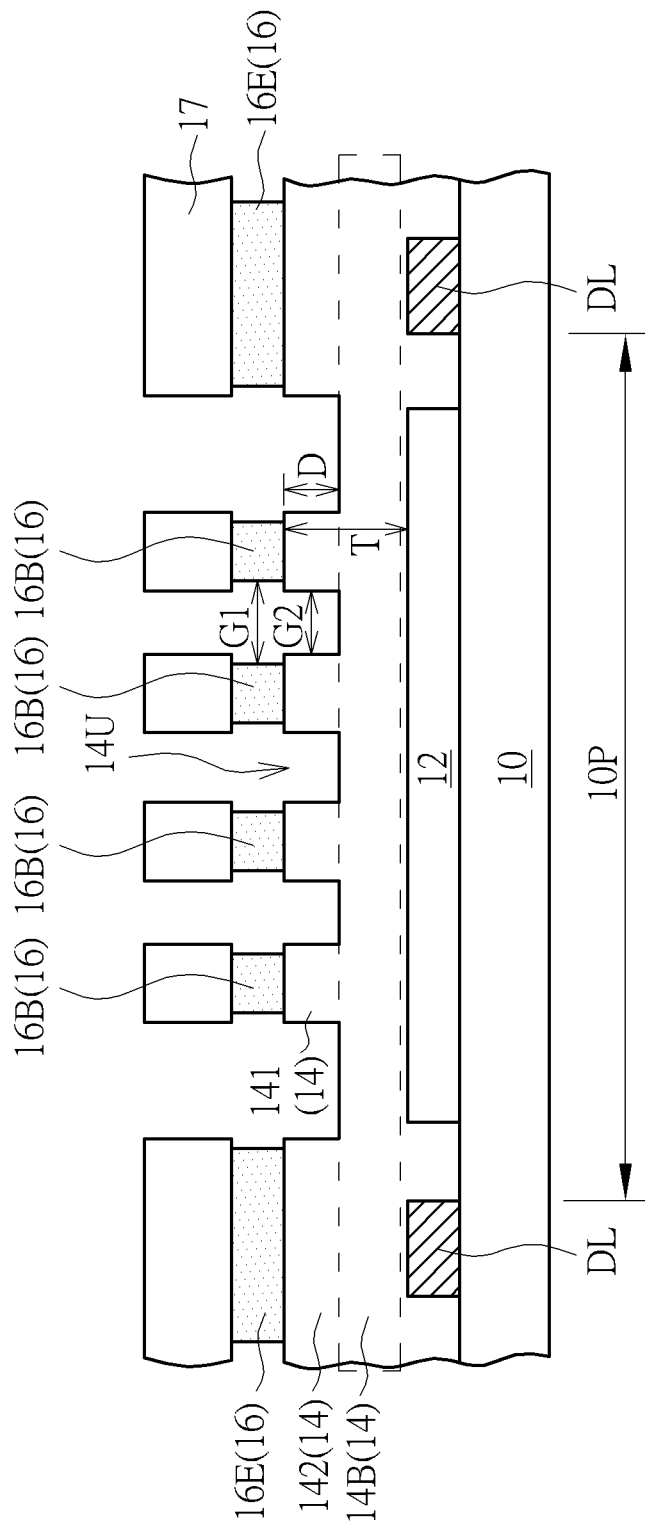
Figure 6:
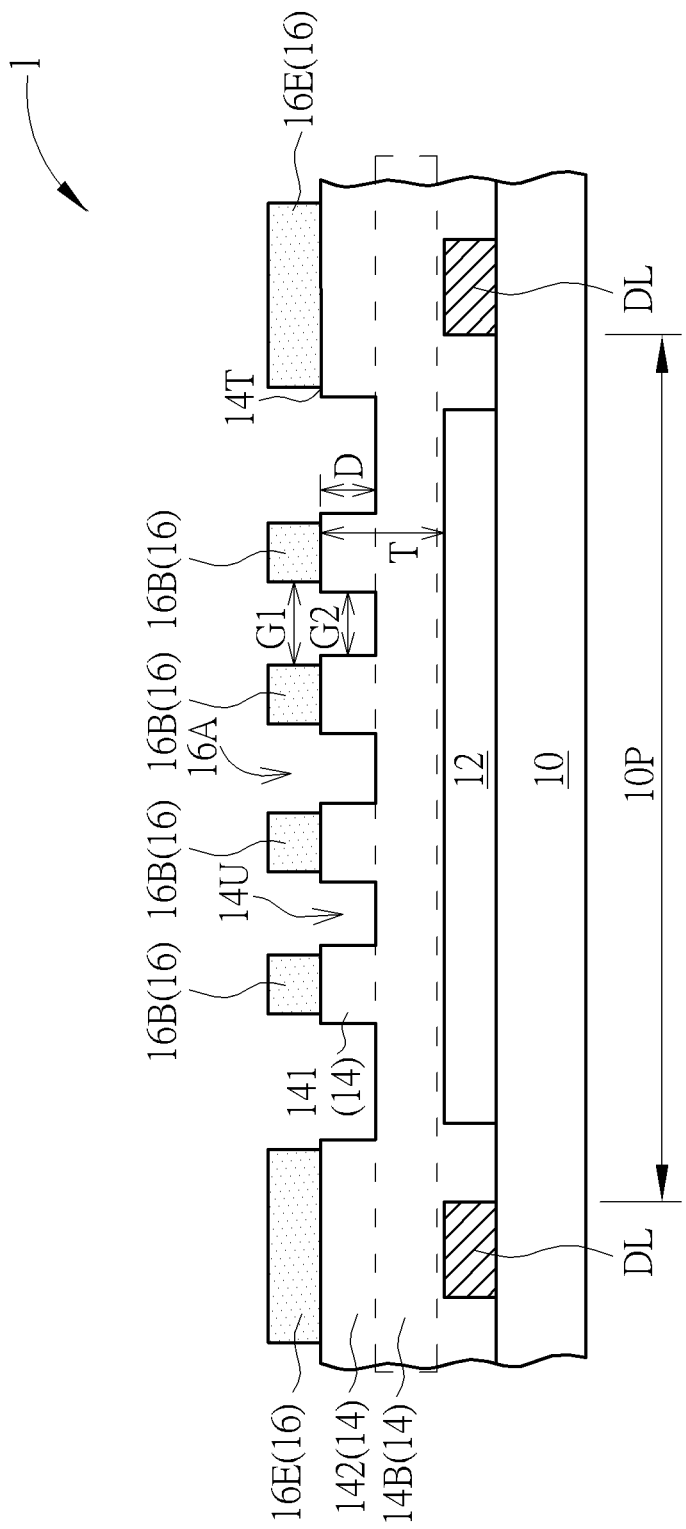

As shown in FIG. 5, the second electrode 16 is then partially removed along the lateral direction to reduce the width of each of the branch electrodes 16B and the width of the fringe electrode 16E so that the gap G1 between two adjacent branch electrodes 16B is greater than the gap G2 between two adjacent first island structures 141. In this embodiment, the gap G1 is about 5 micrometers and the gap G2 is greater than and equal to 2 micrometers and less than 5 micrometers, but not limited thereto. In addition, the second electrode 16 may be partially removed along the lateral direction, for example, by a wet etching process. As shown in FIG. 6, the sacrificial pattern 17 is removed to form the pixel structure 1 of the present invention.

In this embodiment, the cavity 14U is disposed between two adjacent branch electrodes 16B, i.e. the length of the cavity 14U is substantially equal to the length of the branch electrode 16B, but not limited thereto. The pixel structure is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 7:
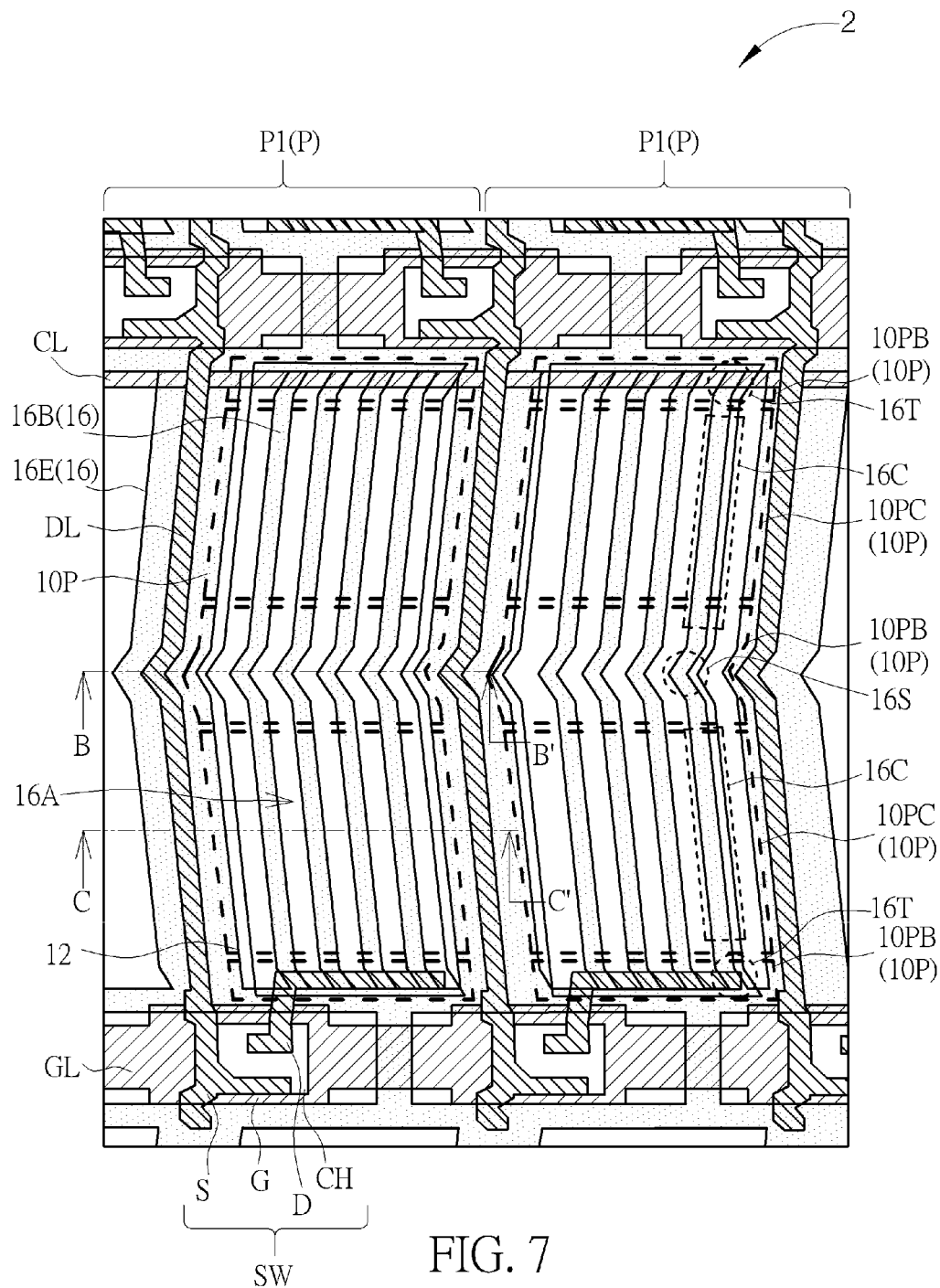
FIG. 7 is a top view of a pixel structure according to a second embodiment of the present invention.
Figure 8:
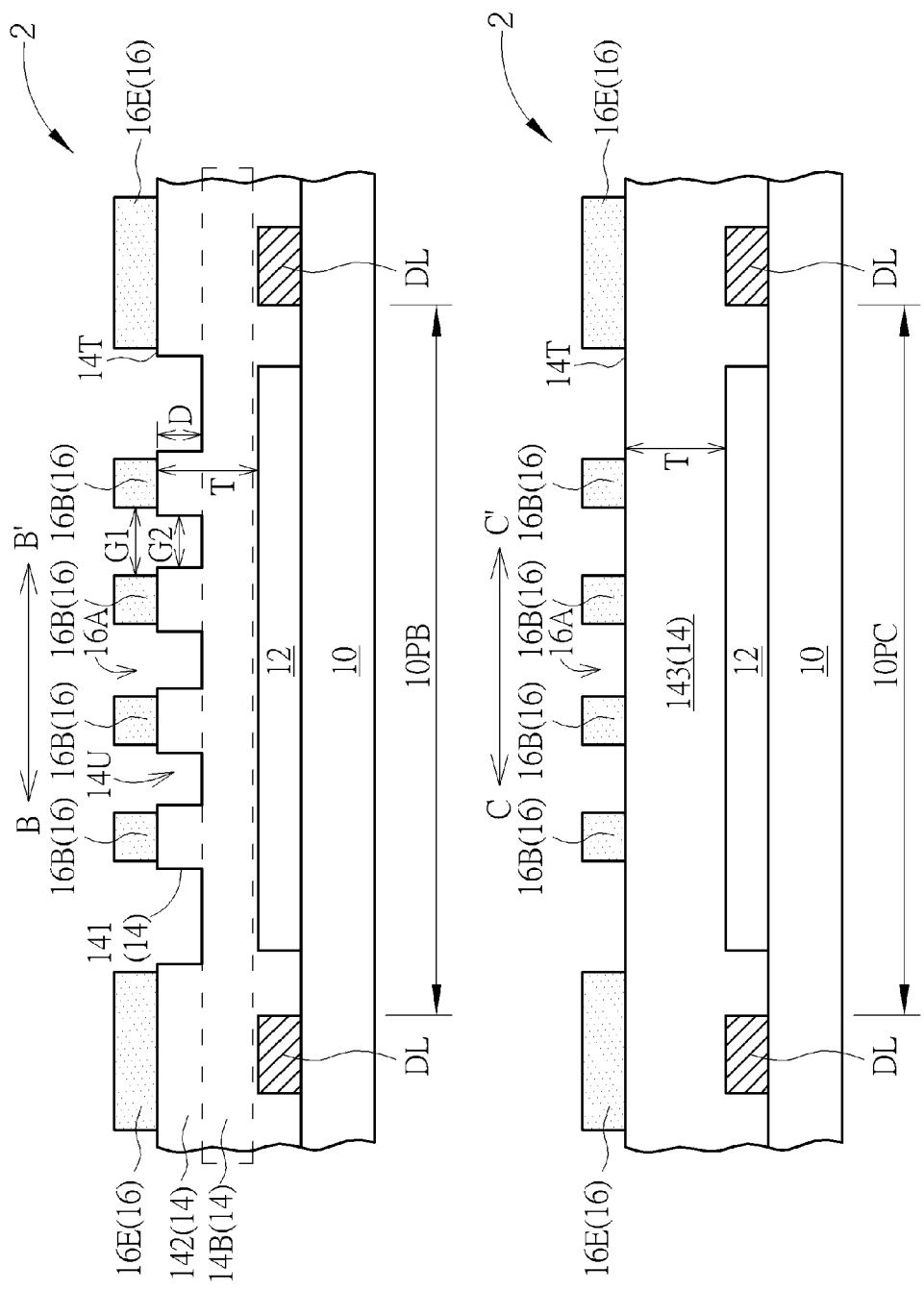
FIG. 8 is a cross-sectional view of the pixel structure of FIG. 7 along line B-B' and line C-C'.

Refer to FIG. 7 and FIG. 8. FIG. 7 is a top view of a pixel structure according to a second embodiment of the present invention, and FIG. 8 is a cross-sectional view of the pixel structure of FIG. 7 along line B-B' and line C-C'. As shown in FIG. 7 and FIG. 8, in the pixel structure 2 of this embodiment, the pixel region 10P has one or more buffer regions 10PB and connection regions 10PC, where the connection region 10PC is disposed between two adjacent buffer regions 10PB, one of the buffer regions 10PB is disposed between two adjacent connection regions 10PC. The first island structure 141 of the first dielectric layer 14 is disposed in the buffer region 10PB, and the flat structure 143 of the first dielectric layer 14 is disposed in the connection region 10PC. The two terminal portions 16T and the bend portion 16S of each branch electrode 16B are disposed in the buffer region 10PB, and the connection portions 16C are disposed in the connection region 10PC. In this embodiment, the first dielectric layer 14 includes the first island structures 141 and the cavities 14U only in the buffer regions 10PB, and the relative positions and details of the first island structures 141, the cavities 14U and the branch electrodes 16B are similar to that of the first embodiment. In the connection region 10PC, the first dielectric layer 14 includes the flat structure 143 without any island structures and cavities. The patterns of the terminal portions 16T and the bend portion 16S of the branch electrode 16B of the second electrode 16 are kinky, which would affects LC efficiency in the buffer region 10PB. Therefore, the first island structures 141 and the cavities 14U of the first dielectric layer 14 may be only disposed in the buffer region 10PB, while the first dielectric layer 14 only includes the flat structure 143 in the connection region 10PC. In such a case, the LC efficiency in the buffer region 10PB is adjusted to be substantially equal to the LC efficiency in the connection region 10PC, and thus the display uniformity of the pixel structure 2 is improved.

Figure 9:
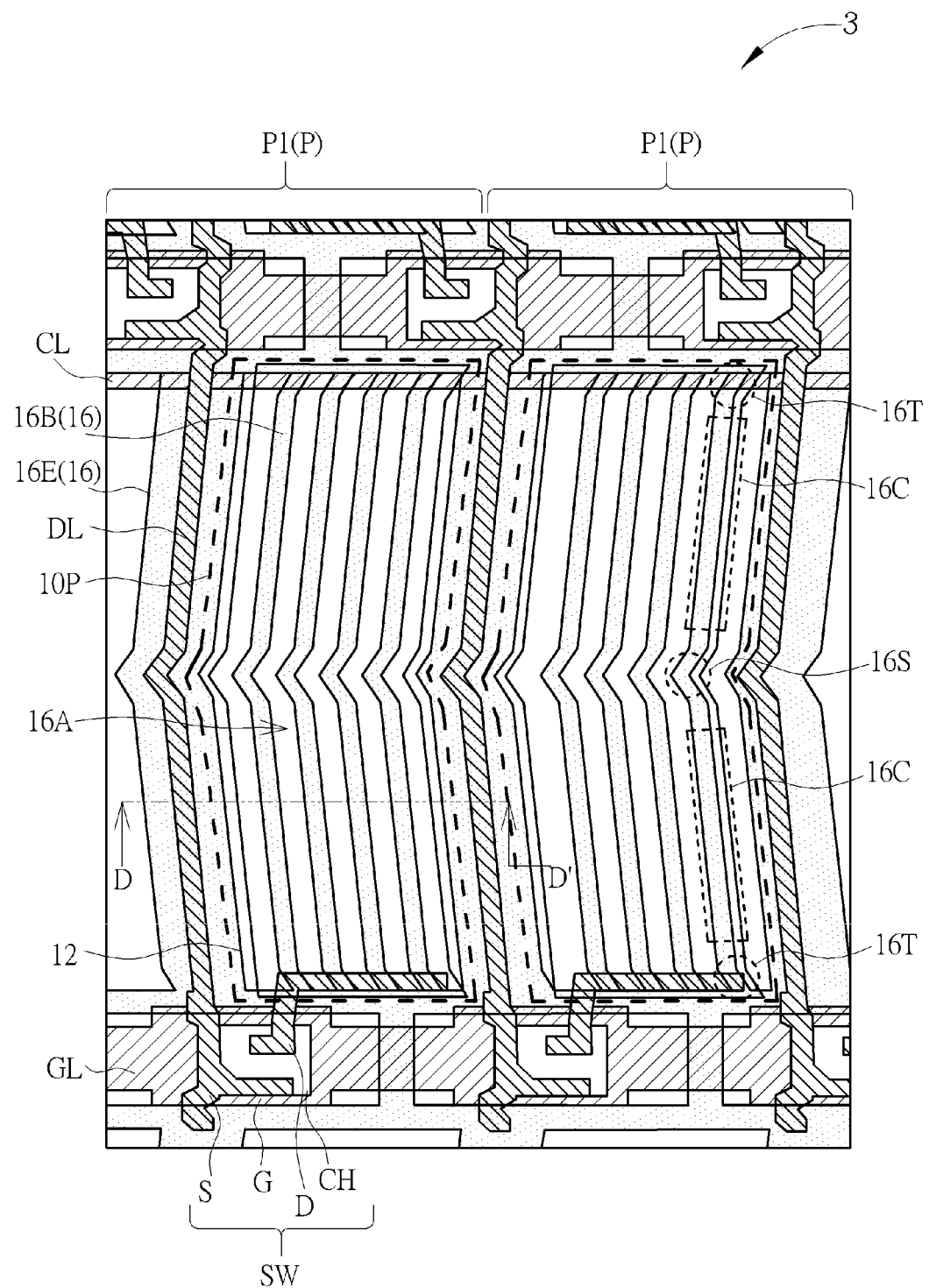
FIG. 9 is a top view of a pixel structure according to a third embodiment of the present invention.
Figure 10:
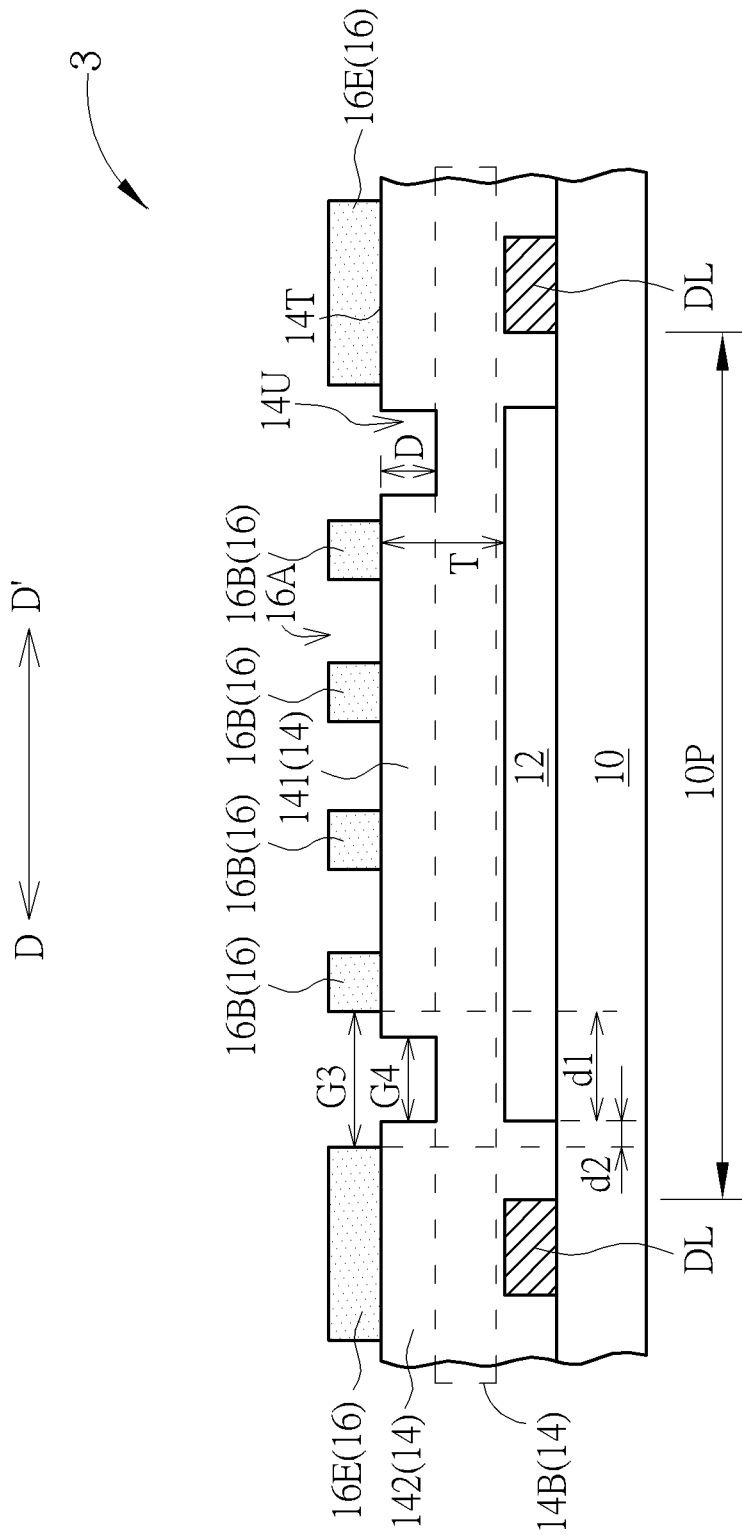
FIG. 10 is a cross-sectional view of the pixel structure of FIG. 9 along line D-D'.

Refer to FIG. 9 and FIG. 10. FIG. 9 is a top view of a pixel structure according to a third embodiment of the present invention, and FIG. 10 is a cross-sectional view of the pixel structure of FIG. 9 along line D-D'. As shown in FIG. 9 and FIG. 10, in the pixel structure 3 of this embodiment, there is only one first island structure 141, and the first island structure 141 and the second island structure 142 disposed on the base structure 14B form the cavity 14U. The thickness sum T of the base structure 14B and the first island structure 141 is greater than the depth D of the cavity 14U. The branch electrodes 16B are disposed on the top surface 14T of the first island structure 141 and partially expose the top surface 14T of the first island structure 141, and the second island structure 142 overlaps the corresponding data line DL. The second electrode 16 may further include a fringe electrode 16E disposed on the top surface 14T of the second island structure 142. The fringe electrode 16E may be electrically connected to the branch electrodes 16B, exposing a portion of the top surface 14T of the second island structure 142, and the gap G3 between the fringe electrode 16E and the adjacent branch electrode 16B is greater than the gap G4 between the second island structure 142 and the adjacent first island structure 141.

As shown in FIG. 10, the distance d1 between the edge of the protruding portion of the first electrode 12 and the edge of the branch electrode 16B of the second electrode 16 in the lateral direction and the distance d2 between the edge of the fringe electrode 16E and the edge of the first electrode 12 in the lateral direction are both influential to electrical field, and thus the LC efficiency is also sensitive to the distance d1 and the distance d2. It is noted that display panels with different pixel per inch (PPI) have different distance d1 and distance d2. Thus, this embodiment is focused on improving the LC efficiency between the fringe electrode 16E and the branch electrode 16B by adjusting the ratio of the gap G3 between the fringe electrode 16E and the adjacent branch electrode 16B to the gap G4 between the second island structure 142 and the adjacent first island structure 141. In this embodiment, the gap G3 is greater than the gap G4. For example, the gap G3 is between 2 micrometers and 6 micrometers, and the gap G4 is between 0.8 micrometers and 6 micrometers, but not limited thereto.

Figure 11:
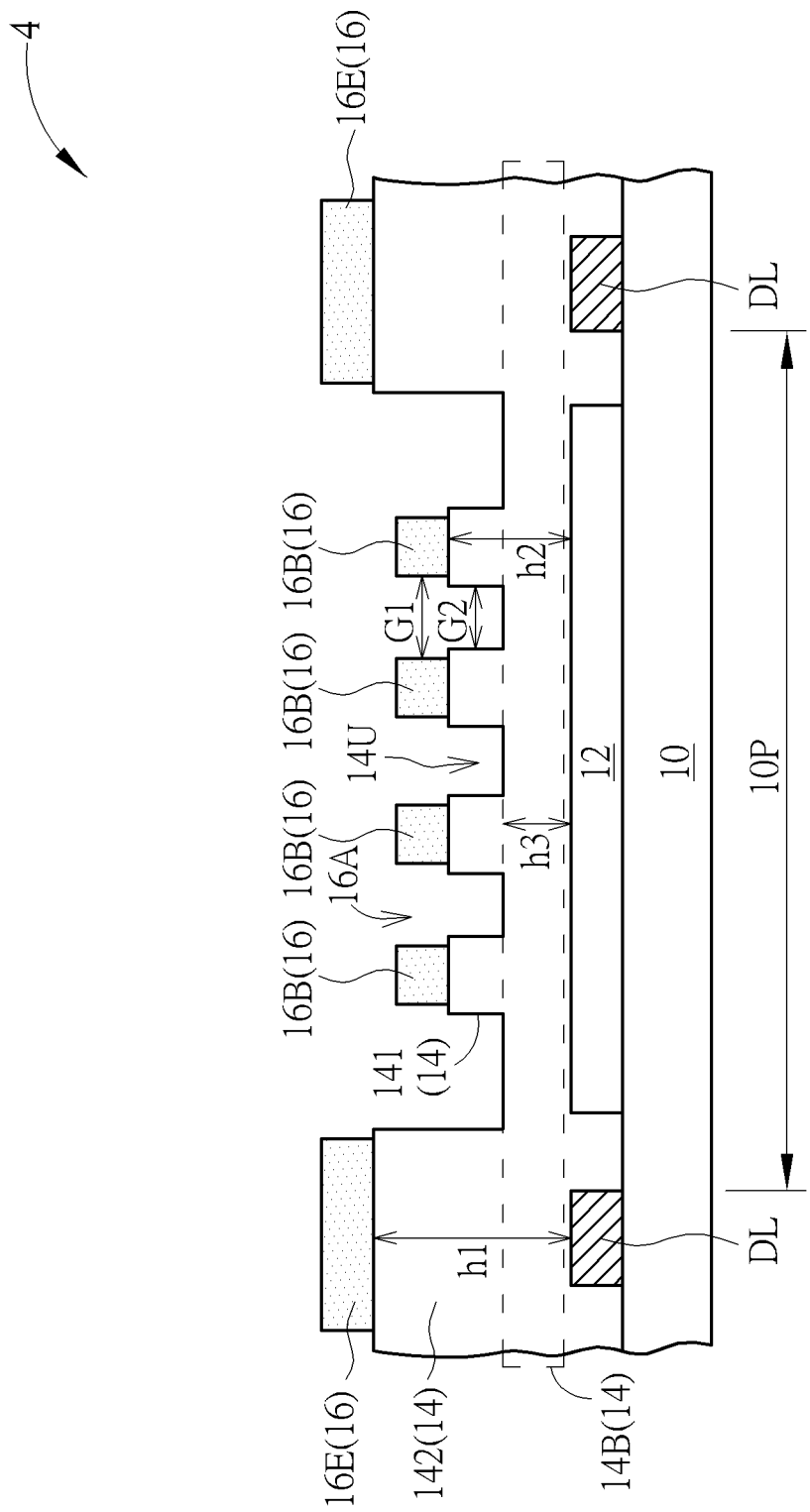
FIG. 11 is a schematic diagram illustrating a pixel structure according to a fourth embodiment of the present invention.

Refer to FIG. 11. FIG. 11 is a schematic diagram illustrating a pixel structure according to a fourth embodiment of the present invention. As shown in FIG. 11, different from the first embodiment, in the pixel structure 4 of this embodiment, the thickness sum h1 of the base structure 14B and the second island structure 142 is greater than the thickness sum h2 of the base structure 14B and the first island structure 141, and the thickness sum h2 of the base structure 14B and the first island structure 141 is greater than the thickness h3 of the base structure 14B. In this embodiment, the thickness sum h1 is, for example, between 0.4 micrometers and 0.8 micrometers, the thickness sum h2 is, for example, between 0.15 micrometers and 0.6 micrometers, and the thickness h3 is, for example, between 0.03 micrometers and 0.48 micrometers, but not limited thereto. In other words, the distance between the branch electrode 16B of the second electrode 16 and the first electrode 12 in the vertical direction is less than the distance between the fringe electrode 16E of the second electrode 16 and the data line DL in the vertical direction. The short distance between the branch electrode 16B of the second electrode 16 and the first electrode 12 increases the liquid crystal electric field, which increases LC efficiency; the long distance between the fringe electrode 16E of the second electrode and the data line DL provides good isolation effect, which diminishes the capacitive load between the fringe electrode 16E of the second electrode 16 and the data line DL, and reduces adverse influences on display.

Figure 12:
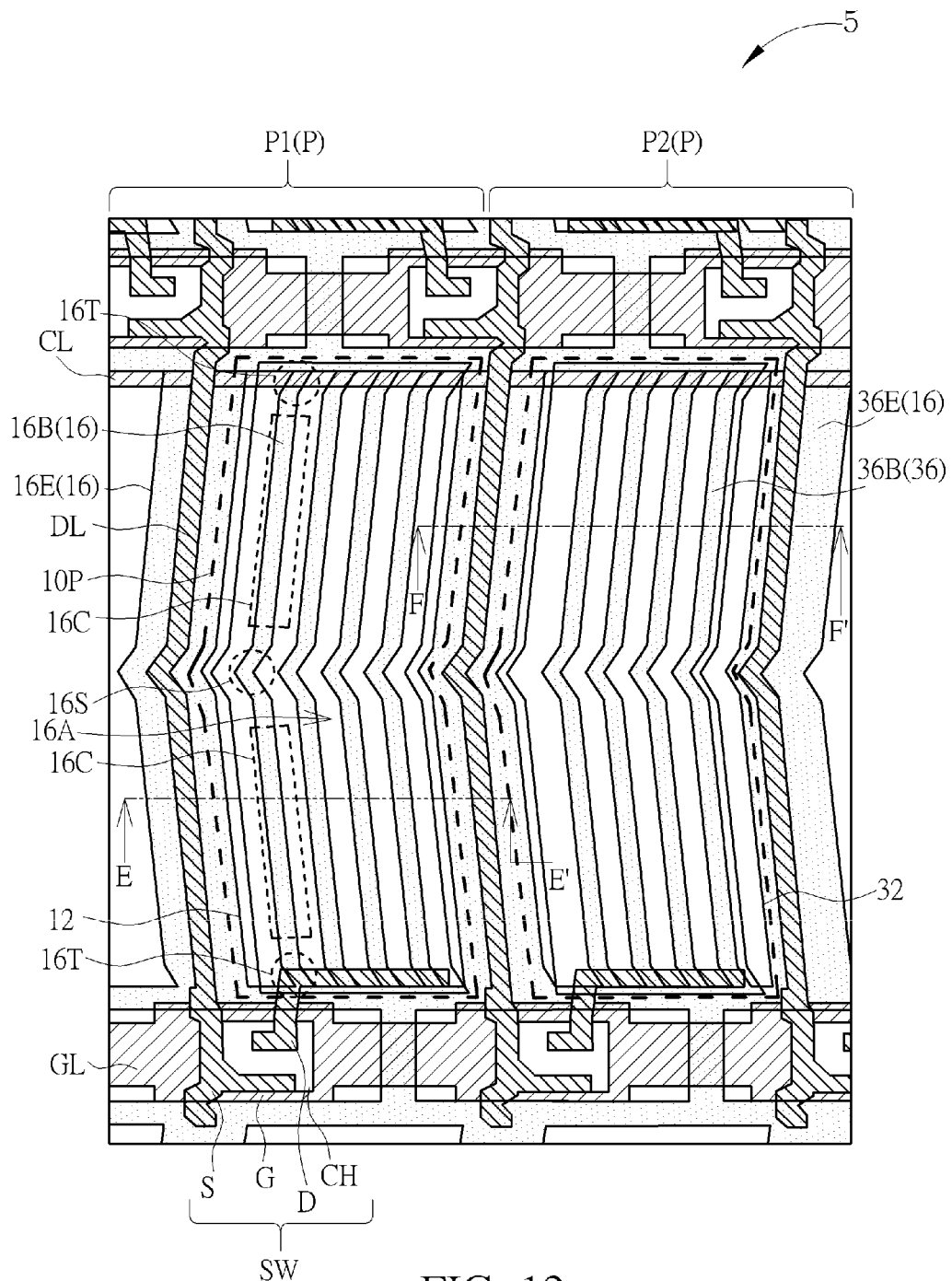
FIG. 12 is a top view of a pixel structure according to a fifth embodiment of the present invention.
Figure 13:
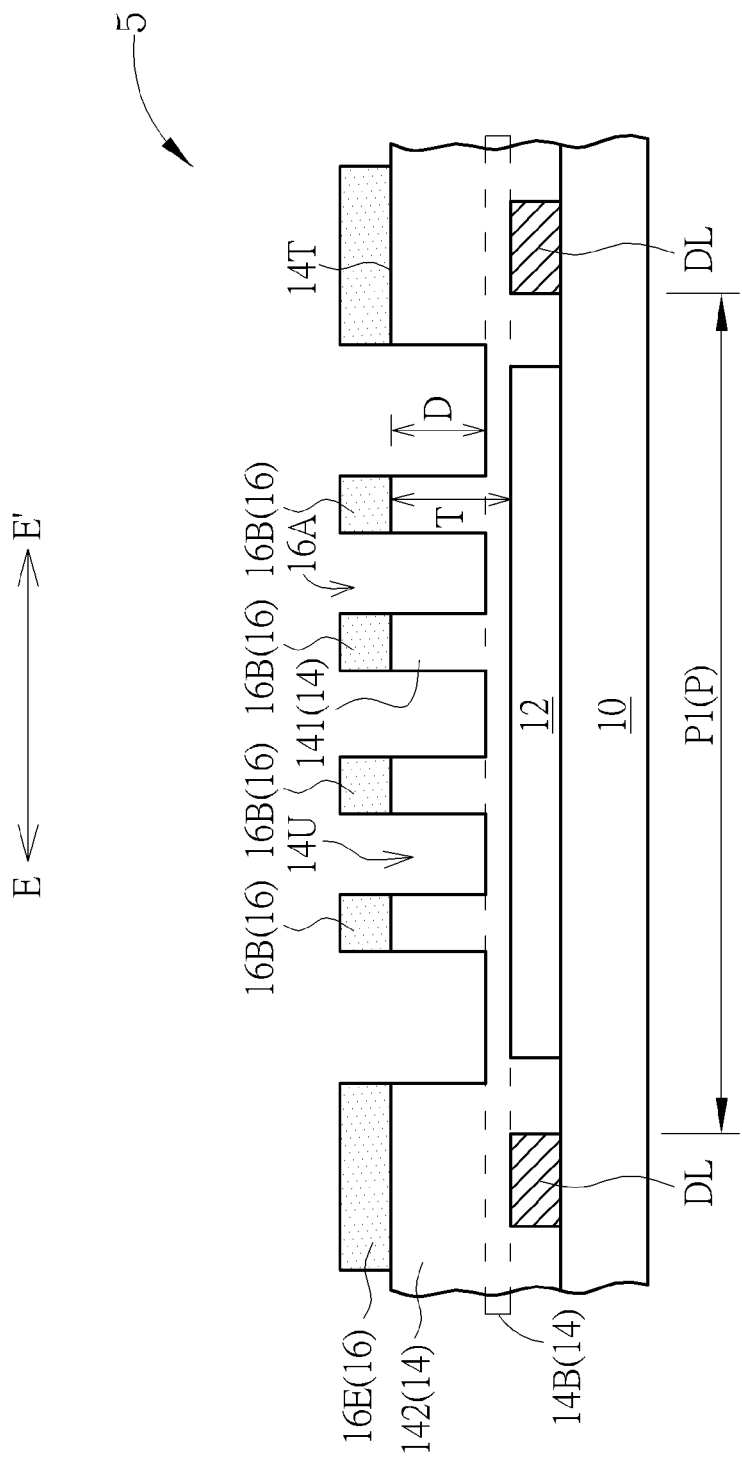
FIG. 13 is a cross-sectional view of the pixel structure of FIG. 12 along line E-E'.
Figure 14:
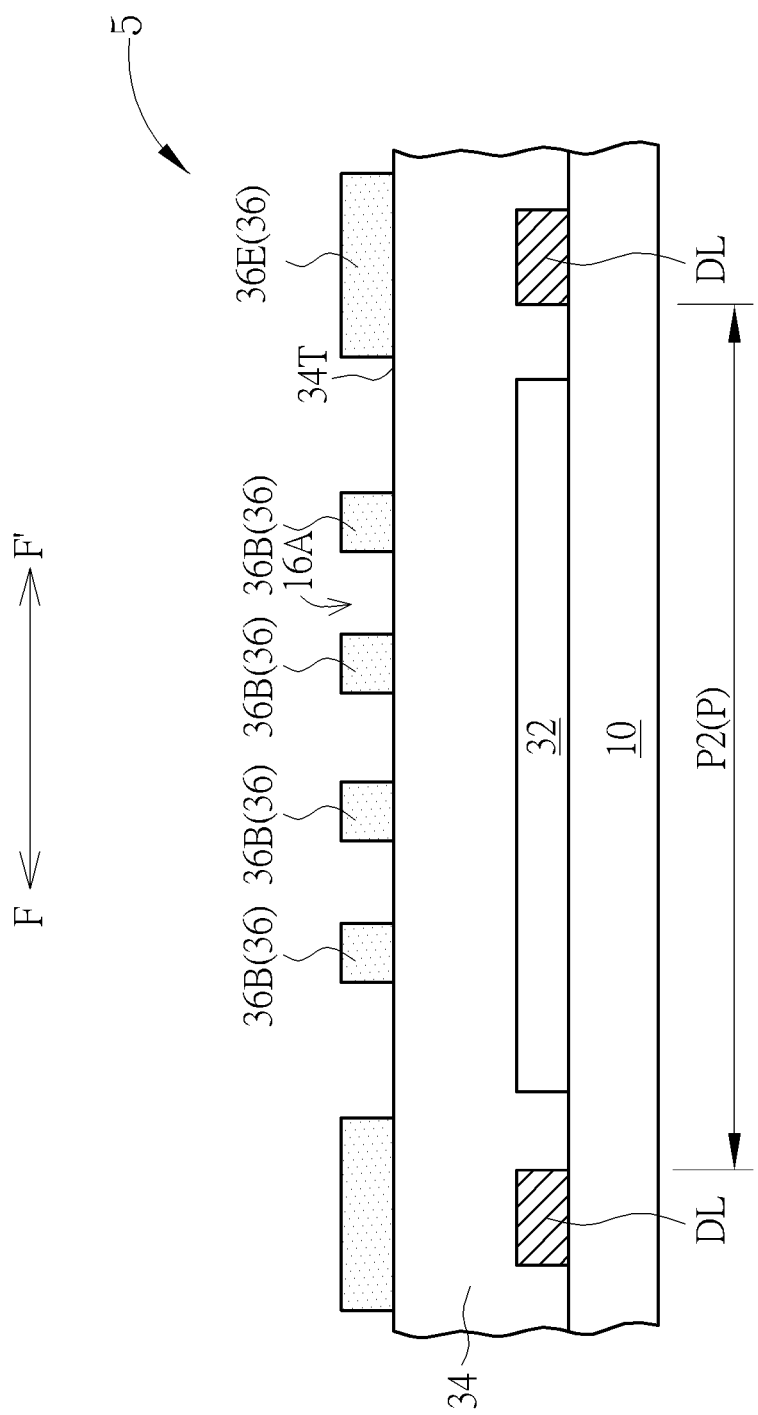
FIG. 14 is a cross-sectional view of the pixel structure of FIG. 12 along line F-F'.

Refer to FIGS. 12-14. FIG. 12 is a top view of a pixel structure according to a fifth embodiment of the present invention, FIG. 13 is a cross-sectional view of the pixel structure of FIG. 12 along line E-E' and FIG. 14 is a cross-sectional view of the pixel structure of FIG. 12 along line F-F'. As shown in FIG. 12, the pixel structure 5 of this embodiment includes at least one first pixel P1 and at least one second pixel P2. As shown in FIG. 13, the first pixel P1 includes a first electrode 12, a first dielectric layer 14 and a second electrode 16. The first electrode 12 is disposed on the substrate 10, and electrically connected to the corresponding data line DL. The first dielectric layer 14 is disposed on the first electrode 12, where the first dielectric layer 14 has at least one first island structure 141, a base structure 14B and at least one second island structure 142, and the first island structure 141 and the second island structure 142 disposed on the base structure 14B form a plurality of cavities 14U. Specifically, two adjacent first island structures 141 and the base structure 14B disposed thereunder forma cavity 14U, and the first island structure 141 and the second island structure 142 adjacently disposed and the base structure 14B disposed thereunder form another cavity 14U. The cavity 14U has a depth D ranging between 0.15 micrometers and 0.8 micrometers, for example. In this embodiment, the first electrode 12 may be a full-surface electrode without any branch electrodes or slits. The second electrode 16 includes a plurality of branch electrodes 16B and at least one fringe electrode 16E, where the branch electrodes 16B are disposed on the top surfaces 14T of the first island structures 141 respectively, and the fringe electrode 16E is disposed on the top surface 14T of the second island structure 142. In this embodiment, the branch electrode 16B may entirely cover the top surface 14T of the first island structure 141 or may partially expose the top surface 14T of the first island structure 141; the fringe electrode 16E may entirely cover the top surface 14T of the second island structure 142 or may partially expose the top surface 14T of the second island structure 142. The first pixel P1 may be the first pixel P1 of any one of the aforementioned embodiments.

As shown in FIG. 14, the second pixel P2 includes a substrate 10, a third electrode 32, a second dielectric layer 34 and a fourth electrode 36. The third electrode 32 is disposed on the substrate 10, and electrically connected to the corresponding data line DL. The second dielectric layer 34 is disposed on the third electrode 32, where the second dielectric layer 34 does not have any island structures, and the top surface 34T of the second dielectric layer 34 is an even surface. The fourth electrode 36 is disposed on the top surface 34T of the second dielectric layer 34. In this embodiment, the third electrode 32 may be a full-surface electrode without any branch electrodes or slits. The fourth electrode 36 includes a plurality of branch electrodes 36B and at least one fringe electrode 36E, and the fourth electrode 36 is electrically connected to a common voltage source. In this embodiment, the third electrode 32 is a pixel electrode, and the fourth electrode 36 is a common electrode, but not limited thereto. For example, in an alternative embodiment, the third electrode may be a common electrode, and the fourth electrode 36 may be a pixel electrode.

In this embodiment, the first pixel P1 and the second pixel P2 are pixels of different colors. This embodiment is focused on individually adjusting LC efficiencies of pixels of different colors. For example, the first pixel P1 is a pixel for displaying blue color (e.g. a blue pixel), and the second pixel P2 is a non-blue pixel such as a red pixel and/or a green pixel. In another alternative embodiment, the pixel structure may include three or more different pixels, and these three pixels have cavities with different depths respectively. For example, the blue pixel has a cavity with the largest depth, the green pixel has a cavity with the shallower depth, and the red pixel has a cavity with the shallowest depth or has no cavity.

Figure 15:
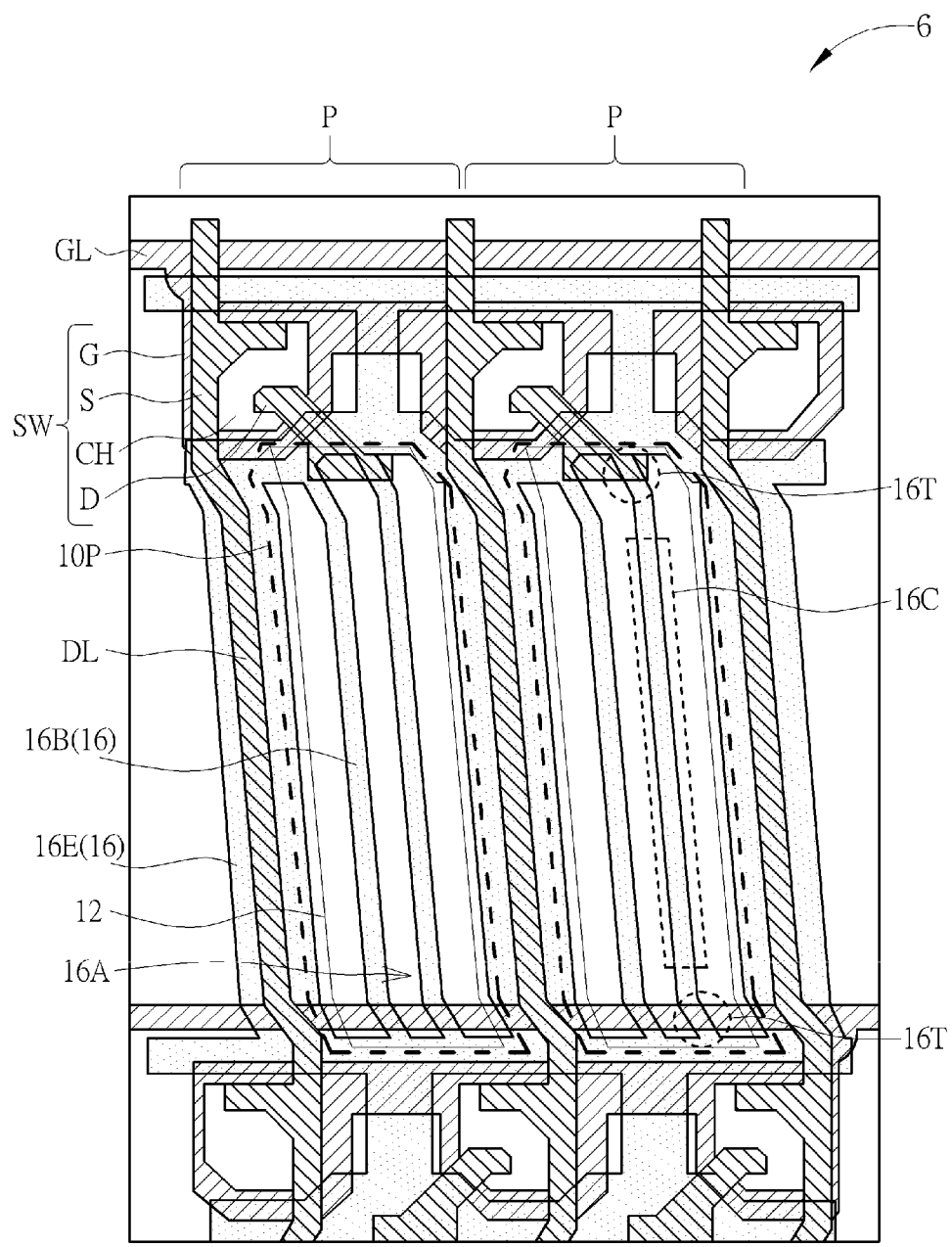
FIG. 15 is a top view of a pixel structure according to a sixth embodiment of the present invention.

Refer to FIG. 15. FIG. 15 is a top view of a pixel structure according to a sixth embodiment of the present invention. As shown in FIG. 15, different from the aforementioned embodiments, in the pixel structure 6 of this embodiment, each branch electrode 16B of the second electrode 16 has only two terminal portions 16T and one connection portion 16C, but does not have any bend portion. In other words, each branch electrode 16B has a bar-shaped structure, and two ends of the connection portion 16C are connected to the terminal portions 16T respectively. The dielectric layer of the pixel structure 6 of this embodiment also has unequal thickness design as the aforementioned embodiments, which is not redundantly described.

In conclusion, the dielectric layer of the pixel structure of the present invention has unequal thickness design, and the gap between adjacent branch electrodes is not equal to the gap of adjacent island structure of the dielectric layer. As a result, LC efficiency is improved without increasing the capacitive load between the common electrode and the data line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
a substrate;
a plurality of gate lines and a plurality of data lines, disposed on the substrate; and
at least one first pixel, disposed on the substrate and electrically connected to one of the gate lines and one of the data lines, wherein the at least one first pixel comprises:
a first electrode, disposed on the substrate;
a first dielectric layer, disposed on the first electrode, wherein the first dielectric layer has at least one first island structure, the at least one first island structure comprises a plurality of first island structures, the first dielectric layer further comprises a base structure and a second island structure, and the first island structures and the second island structure are disposed on the base structure to form a plurality of cavities; and a second electrode, disposed on a top surface of the at least one first island structure, wherein the top surface of the at least one first island structure is partially exposed by the second electrode, the second electrode comprises a plurality of branch electrodes disposed on the to surfaces of the first island structures so that the top surfaces of the first island structures are partially exposed respectively, the second island structure overlaps the corresponding data line, and a gap between two adjacent branch electrodes is greater than a gap between two adjacent first island structures.

2. The pixel structure of claim 1, wherein a ratio of the gap between two adjacent first island structures to the gap between two adjacent branch electrodes is greater than or equal to 40% and less than 100%.

3. The pixel structure of claim 1, wherein a thickness sum of the base structure and the first island structure is greater than a depth of the cavity.

4. The pixel structure of claim 3, wherein a ratio of the depth of the cavity to the thickness sum of the base structure and the first island structure is greater than or equal to 20% and less than or equal to 80%.

5. The pixel structure of claim 1, wherein each of the branch electrodes has two terminal portions, a bend portion and two connection portions, two ends of the connection portions are connected to the terminal portions and the bend portion respectively, the terminal portions are disposed on the top surface of the corresponding first island structure to partially expose the top surface of the first island structure, and the bend portion is disposed on the top surface of the corresponding first island structure to partially expose the top surface of the corresponding first island structure.

6. The pixel structure of claim 1, wherein a thickness sum of the base structure and the second island structure is greater than a thickness sum of the base structure and the first island structure.

7. The pixel structure of claim 1, where the first electrode is electrically connected to the corresponding data line, and the second electrode is electrically connected to a common voltage source.

8. The pixel structure of claim 1, further comprising at least one second pixel disposed on the substrate, wherein the at least one second pixel comprises:
a third electrode, disposed on the substrate;
a second dielectric layer, disposed on the third electrode, wherein the second dielectric layer does not comprise any island structures; and
a fourth electrode, disposed on a top surface of the second dielectric layer.

9. The pixel structure of claim 8, wherein the at least one first pixel and the at least one second pixel are of different colors.

10. The pixel structure of claim 9, wherein the at least one first pixel comprises a blue pixel, and the at least one second pixel comprises a red pixel or a green pixel.

11. The pixel structure of claim 8, wherein the first electrode and the third electrode comprise pixel electrodes, and the second electrode and the fourth electrode comprise common electrodes electrically connected to a common voltage source.

12. A liquid crystal panel, comprising:
the pixel structure of claim 1;
a counter substrate, disposed on the pixel structure; and
a display medium layer, disposed between the pixel structure and the counter substrate.

13. A pixel structure, comprising:
a substrate;
a plurality of gate lines and a plurality of data lines, disposed on the substrate; and
at least one first pixel, disposed on the substrate and electrically connected to one of the gate lines and one of the data lines, wherein the at least one first pixel comprises:
a first electrode, disposed on the substrate;
a first dielectric layer, disposed on the first electrode, wherein the first dielectric layer has at least one first island structure; and
a second electrode, disposed on a top surface of the at least one first island structure; and
at least one second pixel, disposed on the substrate, wherein the at least one second pixel comprises:
a third electrode, disposed on the substrate;
a second dielectric layer, disposed on the third electrode, wherein the second dielectric layer does not comprise any island structures; and
a fourth electrode, disposed on a top surface of the second dielectric layer.

14. The pixel structure of claim 13, wherein the at least one first pixel is a blue pixel, and the at least one second pixel is a non-blue pixel.

15. A liquid crystal panel, comprising:
the pixel structure of claim 13;
a counter substrate, disposed on the pixel structure; and
a display medium layer, disposed between the pixel structure and the counter substrate.

16. A pixel structure, comprising:
a substrate;
a plurality of gate lines and a plurality of data lines, disposed on the substrate; and
at least one first pixel, disposed on the substrate and electrically connected to one of the gate lines and one of the data lines, wherein the at least one first pixel comprises:
a first electrode, disposed on the substrate;
a first dielectric layer, disposed on the first electrode, wherein the first dielectric layer has only one first island structure, the first dielectric layer further comprises a base structure and a second island structure, the first island structure and the second island structure are disposed on the base structure to form a cavity; and
a second electrode, disposed on a top surface of the first island structure, wherein the top surface of the first island structure is partially exposed by the second electrode, the second electrode comprises a plurality of branch electrodes disposed on the top surface of the first island structure to partially expose the top surface of the first island structure, and the second island structure overlaps the corresponding data line, and wherein the second electrode further comprises a fringe electrode, disposed on a top surface of the second island structure to partially expose the top surface of the second island structure, and a gap between the fringe electrode and the adjacent branch electrode is greater than a gap between the second island structure and the adjacent first island structure.

* * * * *